(12) United States Patent
Tsai et al.

(10) Patent No.: US 6,713,856 B2
(45) Date of Patent: Mar. 30, 2004

(54) STACKED CHIP PACKAGE WITH ENHANCED THERMAL CONDUCTIVITY

(75) Inventors: Chung-Che Tsai, Hsin Chu (TW); Wei-Heng Shan, Hsin Chu (TW)

(73) Assignee: Ultratera Corporation, Hsinchu (TW)

( * ) Notice: Subject to any disclaimer, the term of this patent is extended or adjusted under 35 U.S.C. 154(b) by 0 days.

(21) Appl. No.: 10/232,729

(22) Filed: Sep. 3, 2002

(65) Prior Publication Data

US 2004/0041249 A1 Mar. 4, 2004

(51) Int. Cl.⁷ ............................................... H01L 23/02
(52) U.S. Cl. ..................... 257/686; 257/680; 257/777
(58) Field of Search ................................. 257/678, 680, 257/685, 686, 777; 438/106, 109, 121

(56) References Cited

U.S. PATENT DOCUMENTS

| | | | | |
|---|---|---|---|---|
| 5,502,289 A | * | 3/1996 | Takiar et al. ................ 174/266 |
| 5,583,378 A | * | 12/1996 | Marrs et al. ................. 257/710 |
| 5,650,593 A | * | 7/1997 | McMillan et al. ......... 174/52.4 |
| 6,387,728 B1 | | 5/2002 | Pai et al. |
| 2002/0008316 A1 | * | 1/2002 | Miyazaki .................... 257/701 |
| 2003/0042615 A1 | * | 3/2003 | Jiang et al. ................. 257/777 |

OTHER PUBLICATIONS

Wolf et al., Silicon Processing for the VLSI Era, 2000, vol. 1, 851–852.*

* cited by examiner

Primary Examiner—Nathan J. Flynn
Assistant Examiner—Leonardo Andújar
(74) Attorney, Agent, or Firm—Browdy and Neimark, P.L.L.C.

(57) ABSTRACT

A stacked chip package has a substrate with a through hole. A first chip is received in the through hole. A second chip is disposed on the first chip. Two chips are electrically connected to an upper surface of the substrate. An adhesive layer and a planar member, which are thermally and electrically conductive, are disposed on a lower surface of the substrate to support the chips and dissipate the heat generated by the chips. An encapsulant covers the upper surface of the substrate. The package has superior heat-dissipating ability, high yield in assembly and small size.

7 Claims, 2 Drawing Sheets

STACKED CHIP PACKAGE WITH ENHANCED THERMAL CONDUCTIVITY

BACKGROUND OF THE INVENTION

1. Field of the Invention

The present invention relates to an integrated circuit (IC) chip package, and more particularly to a stacked chip package with enhanced thermal dissipation.

2. Description of the Prior Art

U.S. Pat. No. 6,387,728 discloses a conventional stacked chip package 1, as shown in FIG. 1, which comprises a first chip 3 and a second chip 6 stacked each other. The first chip 3 is attached onto the upper surface of a substrate 2. An adhesive layer 5 is interposed between the chips 3, 6. The chips 3, 6 are respectively connected to the upper surface of the substrate 2 through bonding wires 4, 7. An encapsulant 8 covers the chips 3, 6, the bonding wires 4, 7 and a portion of the upper surface of the substrate 2.

The stacked chip package includes two or more chips disposed on a substrate. It saves space efficiently. But the heat generated by the chips is hard to dissipate. The high temperature may disable the chips. Besides, because the bonding wires 4 are not protected when the second chip 6 is disposed on the adhesive layer 5, the second chip 6 may touch the bonding wires 4 and destroy them. It will draw down the yield dramatically.

SUMMARY OF THE INVENTION

It is the primary objective of the present invention to provide a stacked chip package having superior heat-dissipating ability.

It is another objective of the present invention to provide a stacked chip package that can enhance the yield thereof.

It is still another objective of the present invention to provide a stacked chip package saving space more efficiently thereof.

In keeping with the principle of the present invention, the foregoing objectives of the present invention are attained by the stacked chip package comprising a substrate, a first chip, a thermally and electrically conductive adhesive layer, a thermally and electrically conductive planar member, a first encapsulant, a second chip, a second encapsulant, and a plurality of solder balls. The substrate has an upper surface, a lower surface and a through hole. The first chip has an active side and an inactive side and is received in the through hole of the substrate in such a way that the active side of the first chip and the upper surface of the substrate face to a same direction. The active side of the first chip is electrically connected to the upper surface of the substrate through first bonding wires. The adhesive layer is disposed on the inactive side of the first chip and the lower surface of the substrate in a completely enclosing way around the through hole. The planar member has an upper surface and a lower surface and is attached to the adhesive layer with the upper surface thereof. The first encapsulant is disposed on the active side of the first chip. The second chip has an active side and an inactive side and is attached to the first encapsulant with the inactive side thereof. The active side of the second chip is electrically connected to the upper surface of the substrate through second bonding wires. The second encapsulant is disposed on the upper surface of the substrate and covers the first chip, the first bonding wires, the first encapsulant, the second chip and the second bonding wires. The second encapsulant also fills the through hole. The solder balls are electrically connected to the lower surface of the substrate.

The foregoing objectives, features, and advantages of the present invention will be more readily understood upon a thoughtful deliberation of the following detailed description of a preferred embodiment of the present invention with reference to the accompanying drawings.

BRIEF DESCRIPTION OF THE DRAWINGS

As shown in FIG. 2, there depicts an embodiment of a stacked chip package 10 within the present invention. The package 10 includes a substrate 12, a first chip 20, a thermally and electrically conductive adhesive layer 26, a thermally and electrically conductive planar member 27, a first encapsulant 30, a second chip 34, a second encapsulant 40, and a plurality of solder balls 42.

Figure 1:
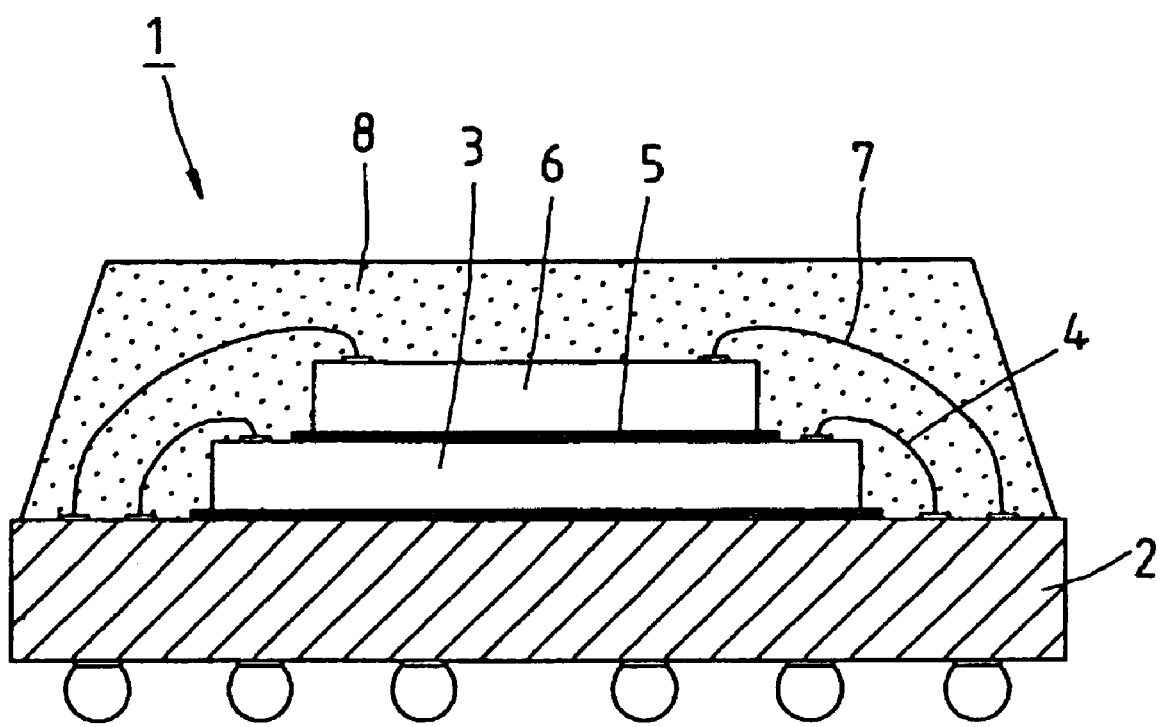
FIG. 1 is a cross-sectional view of a conventional stacked chip package.
Figure 2:
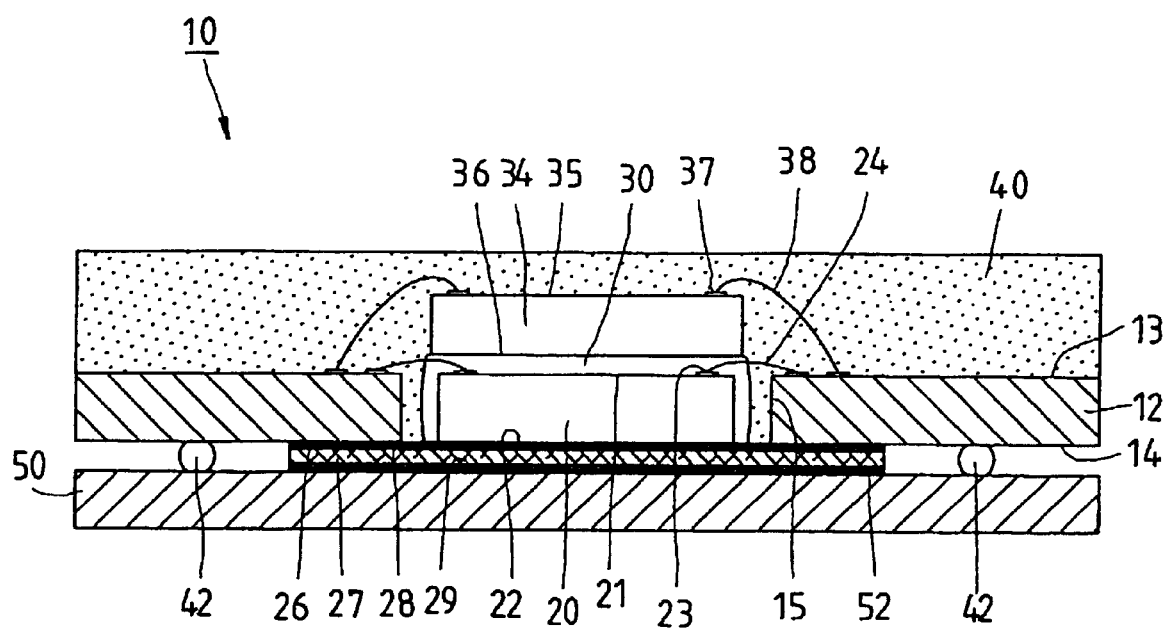
FIG. 2 is a cross-sectional view of a stacked chip package according to a preferred embodiment of the present invention.

The substrate 12 is formed of a suitable insulative material, such as a fiberglass reinforced epoxy resin. The substrate 12 has an upper and a lower surfaces 13, 14 with predetermined conductive circuit patterns which are electrically connected to each other through vias (not shown). The substrate 12 has a central through hole 15 formed through the thickness of the substrate 12 such that the central through hole 15 communicates the upper surface 13 of the substrate 12 to the lower surface 14 of the substrate 12.

The first chip 20 has an active side 21 and an inactive side 22. The first chip 20 is received in the through hole 15 of the substrate 12 in such a way that the active side 21 of the first chip 20 and the upper surface 13 of the substrate 12 face to a same direction. The active side 21 of the first chip 20 has a plurality of bonding pads 23 electrically connected to the conductive circuit pattern on the upper surface 13 of the substrate 12 through first bonding wires 24. The first bonding wires 24 are made of ductile and electrically conductive material, such as gold.

The thermally and electrically conductive adhesive layer 26, such as a copper paste, is disposed on the inactive side 22 of the first chip 20 and the lower surface 14 of the substrate 12 in a completely enclosing way around the through hole 15.

The thermally and electrically conductive planar member 27, such as a thin copper plate, has an upper surface 28 and a lower surface 29. The planar member 27 is attached to the adhesive layer 26 with the upper surface 28 thereof.

The first encapsulant 30 is disposed on the active side 21 of the first chip 20. The first encapsulant 30 covers the bonding pads 23 and one end of the first bonding wires 24. The first encapsulant 30 is typically made of epoxy resin, silicone or other resin. The first encapsulant 30 serves as a protection layer and an adhesive layer.

The second chip 34 has an active side 35 and an inactive side 36. The second chip 34 is attached to the first encapsulant 30 with the inactive side 36 thereof. The active side 35 of the second chip 34 has a plurality of bonding pads 37 electrically connected to the conductive circuit pattern on the upper surface 13 of the substrate 12 through second bonding wires 38.

The second encapsulant 40 is disposed on the upper surface 13 of the substrate 12. The second encapsulant 40 covers the first chip 20, the first bonding wires 24, the first encapsulant 30, the second chip 34 and the second bonding wires 38. The second encapsulant 40 also fills the through hole 15.

The solder balls 42 are electrically connected to the conductive circuit pattern on the lower surface 14 of the substrate 12.

When being use, the package 10 is solder-mounted to a circuit board 50, or main board, by the solder balls 42 attached at the substrate 12. The lower surface 29 of the planar member 27 is bonded to the circuit board 50 through an adhesive tape 52 made of thermally and electrically conductive material, such as a copper paste. It allows that the heat generated by the chips 20, 34 is directly transferred through the adhesive layer 26, the planar member 27 and the adhesive tape 52 to the circuit board 50(the whole system). Therefore, the stacked chip package 10 provided by the present invention has superior heat-dissipating ability. Furthermore, the electrical circuit of the package can be directly grounded to the circuit board 50 through the adhesive layer 26, the planar member 27 and the adhesive tape 52. As a result, the circuit design can be much more free.

When assembling the stacked chip package 10 of the present invention, the first bonding wires 24 are protected by the first encapsulant 30, therefore the second chip 34 will not touch the first bonding wires 24 and destroy them by accident. It will enhance yield of assembly. In addition, the first chip 20 is completely received in the through hole 15 of the substrate 12. This structure saves space more efficiently. Moreover, when the chip can be made much thinner, two or more chips can be completely received in the through hole 15. It further reduces the volume of the package.

Figure 3:
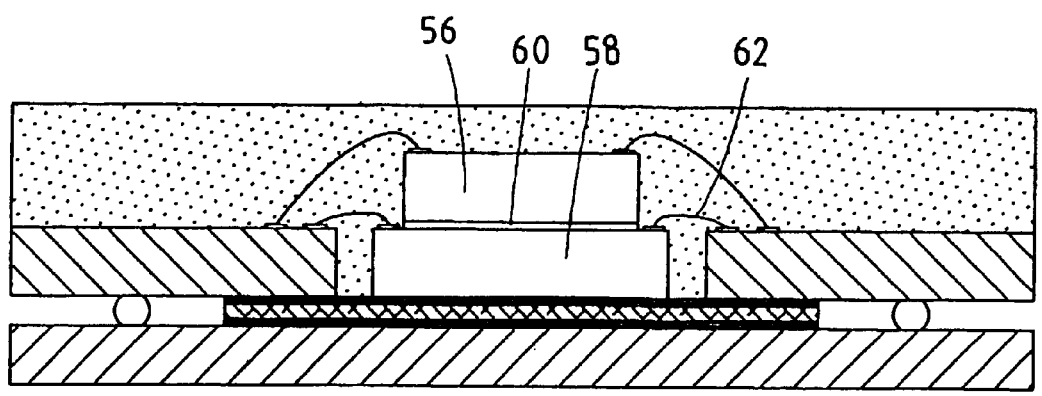
FIG. 3 is a cross-sectional view of a stacked chip package according to an alternative embodiment of the present invention.

As shown in FIG. 3, there depicts an alternative embodiment of a stacked chip package within the present invention. In case of a second chip 56 is smaller than a first chip 58, there will be no need to make a first encapsulant 60 cover first bonding wires 62 because the second chip 56 will hardly touch the first bonding wires 62 and destroy them.

Although the preferred embodiments of the present invention have been disclosed for illustrative purpose, those skilled in the art will appreciate that various modifications, additions and substitutions are possible, without departing from the scope and spirit of the invention as disclosed in the accompanying claims.

What is claimed is:

1. A stacked chip package comprising:
    a substrate having an upper surface, a lower surface and a through hole extended from the upper surface to the lower surface;
    a first chip having an active side and an inactive side, the first chip being received in the through hole of the substrate in such a way that the active side of the first chip and the upper surface of the substrate face to a same direction, the active side electrically connected to the upper surface of the substrate through first bonding wires;
    a thermally and electrically conductive adhesive layer disposed on the inactive side of the first ship and the lower surface of the substrate in a completely enclosing way around the through hole;
    a thermally and electrically conductive planar member having an upper surface and a lower surface, the planar member being attached to the adhesive layer with the upper surface thereof;
    a first encapsulant being disposed on the active side of the first chip;
    a second chip having an active side and an inactive side, the second chip being attached to the first encapsulant with the inactive side thereof, the active side of the second chip electrically connected to the upper surface of the substrate through second bonding wires;
    a second encapsulant being disposed on the upper surface of the substrate, the second encapsulant covering the first chip, the first bonding wires, the first encapsulant, the second chip and the second bonding wires, the second encapsulant also filling the through hole; and
    a plurality of solder balls being electrically connected to the lower surface of the substrates,
    wherein the lower surface of the thermally and electrically conductive planar member is bonded to a circuit through an adhesive tape made of thermally and electrically conductive material.

2. The stacked chip package of claim 1, wherein the thermally and electrically conductive planar member is a copper plate.

3. The stacked chip package of claim 1, wherein the thermally and electrically conductive adhesive layer is a copper paste.

4. The stacked chip package of claim 1, wherein the first bonding wires and the second bonding wires are made of gold.

5. The stacked chip package of claim 1, wherein the first encapsulant covers at least a portion of the first bonding wires.

6. The stacked chip package of claim 1, wherein the first encapsulant is interposed between the first chip and the second chip, but not covering the first bonding wires.

7. The stacked chip package of claim 1, wherein the solder balls are electrically connected to a circuit board.

* * * * *